(12) United States Patent
Sadowski

(10) Patent No.: US 9,762,248 B1
(45) Date of Patent: Sep. 12, 2017

(54) PRE-SYNCHRONIZER

(71) Applicant: Advanced Micro Devices, Inc., Sunnyvale, CA (US)

(72) Inventor: Greg Sadowski, Boxborough, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 15/158,086

(22) Filed: May 18, 2016

(51) Int. Cl.
*H03L 7/00* (2006.01)
*H03K 5/135* (2006.01)
*H03K 19/20* (2006.01)
*H03L 7/081* (2006.01)
*H03K 5/00* (2006.01)

(52) U.S. Cl.
CPC ............. *H03L 7/00* (2013.01); *H03K 5/135* (2013.01); *H03K 19/20* (2013.01); *H03L 7/081* (2013.01); *H03K 2005/00234* (2013.01)

(58) Field of Classification Search
CPC ........................................................ H03L 7/00
See application file for complete search history.

(56) References Cited

U.S. PATENT DOCUMENTS

| 7,977,976 | B1 * | 7/2011 | Tang | H03K 5/135 326/93 |
|---|---|---|---|---|
| 8,593,171 | B2 | 11/2013 | Kosonocky et al. | |
| 9,552,892 | B1 | 1/2017 | Kosonocky et al. | |
| 2004/0163022 | A1 | 8/2004 | Whetsel | |

* cited by examiner

*Primary Examiner* — Daniel Puentes
(74) *Attorney, Agent, or Firm* — Zagorin Cave LLP

(57) ABSTRACT

The arrival time of an asynchronous signal from an asynchronous domain at a synchronizer circuit of a synchronous domain is modified by injecting synchronous domain timing into an additional last stage of the asynchronous logic function generating the asynchronous signal. That reduces the probability of metastability by increasing the probability that the asynchronous signal will arrive at the synchronizer at a time that can guarantee the setup time for the flip-flop(s) of the synchronizer.

20 Claims, 4 Drawing Sheets

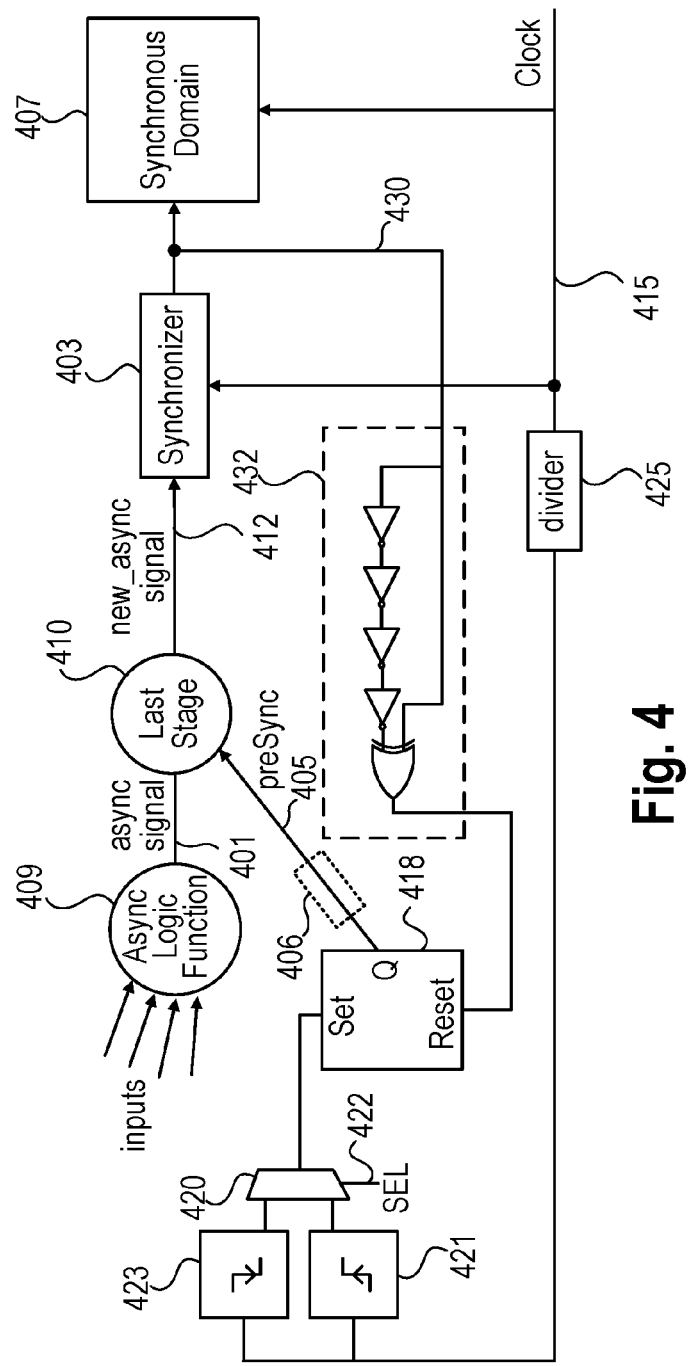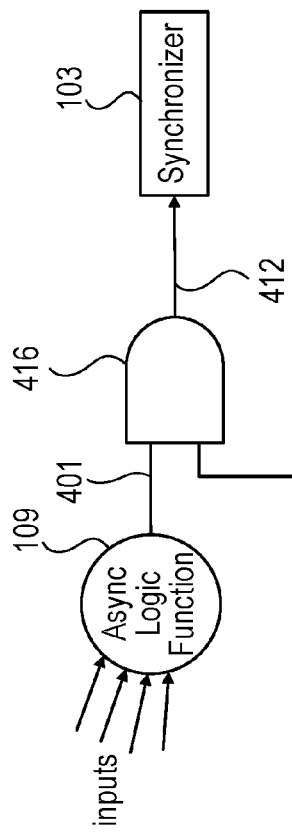
Fig. 4
Fig. 5

PRE-SYNCHRONIZER

BACKGROUND

Field of the Invention

The invention relates to synchronization when transferring data from asynchronous to synchronous domains.

Description of the Related Art

The transfer of a signal from an asynchronous domain to a synchronous domain involves a synchronizer circuit. Every synchronizer circuit has a certain probability of entering a metastable state. Metastability refers to a circuit, such as a flip-flop, whose output is unstable and may oscillate between a logical 0 and a logical 1 or remain at a voltage level between a logical 0 and a logical 1. The circuit typically settles to either the 0 state or the 1 state but not necessarily the correct state.

When in a metastable state, a synchronizer takes extra time to resolve the metastability, which can reduce system performance. FIGS. 1A and 1B illustrate the classic solution to deal with metastability that passes the asynchronous signal 101 through a synchronizer circuit 103 formed by a series of flip-flops 104 (FIG. 1B) clocked by a clock 105 associated with the synchronous domain 107. The synchronizer circuit 103 waits out the metastable state, if any, and supplies the synchronized output 106. The asynchronous logic function 109 supplies the asynchronous signal 101. The asynchronous logic function can be any function generating the asynchronous signal. For example, the asynchronous signal 101 can indicate that an instruction (e.g., a multiplication) has completed execution, or that a data packet has arrived, or that a condition exists such as a battery warning or thermal warning requiring action be taken.

Referring to FIG. 2, the asynchronous signal arrival time t1 of asynchronous signal 201 as referenced to the rising (or falling) edge of the clock signal can be at any time between two rising edges of the clock signal. As shown in FIG. 2, the arrival time is indicated by the asynchronous signal transitioning from a low level to a high level at time t1. There is no relation between the arrival time t1 of the asynchronous signal and the timing of the synchronous domain. As shown in FIG. 3, the probability distribution of t1 arriving at any particular time is uniform or flat. Thus, the probability of the arrival time t1 is the same for all values of $t1: 0 \leq t1 \leq T$. The well-known formula for Mean Time Between Failures (MTBF) assumes uniform distribution of the arrival time as well.

The probability of metastability occurring can be calculated as W/T where W is the forbidden time window in which the asynchronous signal should not arrive or the metastable state can be entered. In an example shown in FIG. 3, W is shown as a particular set up time prior to the rising edge 301 of the clock signal. The value and location of W is a function of the particular synchronizer circuit utilized.

Reducing the likelihood of metastable states occurring can reduce failure rates and improve system performance.

SUMMARY OF EMBODIMENTS OF THE INVENTION

In one embodiment, a method includes generating a pre-synchronizer signal based on at least a first synchronous signal and a second synchronous signal. The method further includes logically combining the pre-synchronizer signal with an asynchronous signal to generate a combined signal and supplying the combined signal to a synchronizer circuit. The output of the synchronizer circuit is supplied as the first synchronous signal.

In another embodiment, an apparatus includes a pre-synchronizer circuit coupled to receive a first synchronous signal and a second synchronous signal and supply a pre-synchronizer signal. A logic circuit logically combines the pre-synchronizer signal and an asynchronous signal and supplies a combined signal. A synchronizer circuit is coupled to receive the combined signal and to receive a clock signal and generates a synchronized combined signal that is synchronized to a synchronous domain. The pre-synchronizer circuit is coupled to receive the synchronized combined signal and the clock signal as the first synchronous signal and the second synchronous signal, respectively.

In another embodiment, a method includes generating a pre-synchronizer signal based on an output of a synchronizer circuit and a clock signal. An asynchronous signal is gated in a gating circuit using the pre-synchronizer signal to allow an asserted value of the asynchronous signal to be supplied to the synchronizer circuit only when pre-synchronizer signal is asserted. A synchronizer circuit receives an output of the gating circuit. The pre-synchronizer signal is deasserted responsive to the output of a synchronizer circuit being asserted and is asserted responsive to an edge of the clock signal.

BRIEF DESCRIPTION OF THE DRAWINGS

The present invention may be better understood, and its numerous objects, features, and advantages made apparent to those skilled in the art by referencing the accompanying drawings.

FIG. 4 illustrates an embodiment for injecting a synchronous signal into an asynchronous function to reduce the likelihood of metastability.

FIG. 5 illustrates additional details of an embodiment for injecting a synchronous signal into an asynchronous function.

The use of the same reference symbols in different drawings indicates similar or identical items.

DETAILED DESCRIPTION

Figure 1A:
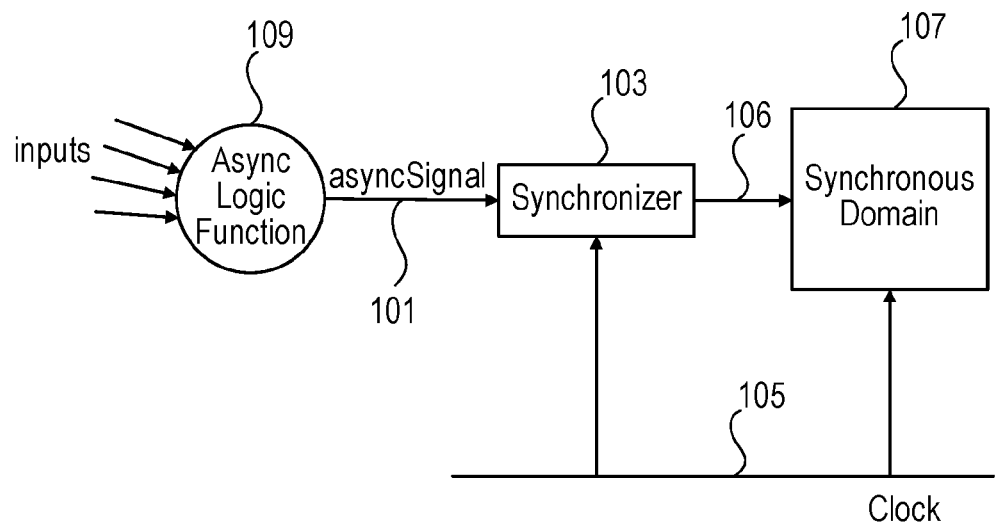
FIG. 1A illustrates an embodiment of a system supplying a signal from an asynchronous domain to a synchronous domain.
Figure 1B:
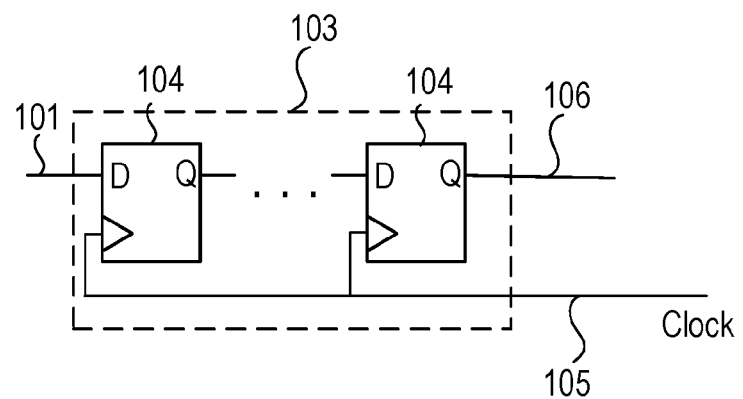
FIG. 1B illustrates an embodiment of a synchronizer that may be used in the system of FIG. 1A.
Figure 2:
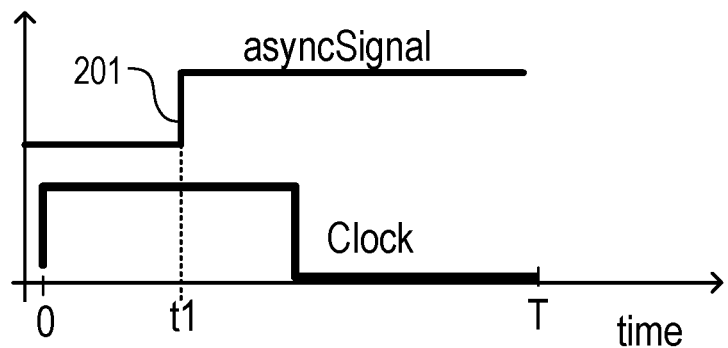
FIG. 2 illustrates the arrival time of an asynchronous signal.
Figure 3:
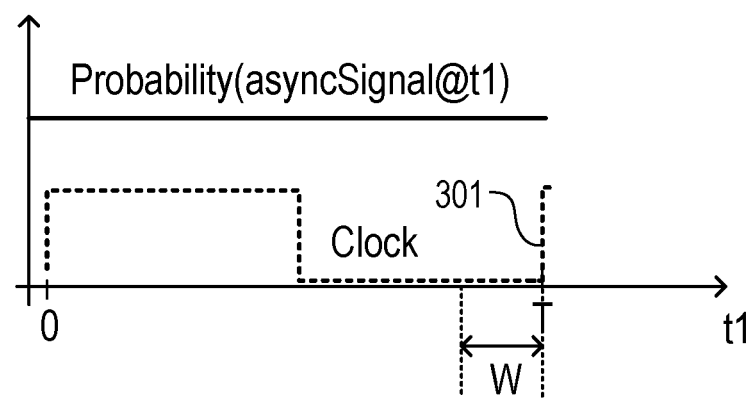
FIG. 3 illustrates the uniform probability distribution of an asynchronous signal arrival time.

Embodiments described herein change the probability distribution of an asynchronous signal arriving from a uniform distribution to a distribution that lowers the probability of metastability occurring. Depending on the synchronizer used, it can be advantageous for the asynchronous signal to arrive during the time interval when the clock signal is at a high voltage level. When the asynchronous signal arrives when the clock signal is at a high level, the signal is guaranteed to make the set up time of the receiving flip-flop and the asynchronous signal will smoothly cross into synchronous domain with no delay and perhaps, more importantly, without entering the metastable state of the flip-flop(s).

Referring to FIG. 4, the controlled modification of arrival time of an asynchronous signal 401 to the synchronizer circuit 403 (which can be similar or identical to synchronizer circuit 103) can be achieved by injection of receiving clock timing into an additional last stage (or stages) 410 of the asynchronous logic function 409. The asynchronous logic function 409 may be similar to asynchronous logic function 109. The asynchronous logic function may also be referred to as a self-timed circuit since it does not use a global clock signal. The idea is to inject a signal (preSync) 405 from the clocked (or synchronous) domain 407 into the asynchronous logic function 409 such that the resulting new_async signal 412 arrives in a modified relation to the clock signal 415 of the synchronous domain such that the probability of arrival is no longer evenly distributed.

FIG. 5 illustrates a simple way to inject the preSync signal by gating the async signal 401 with the preSync signal 405 in AND gate 416. That is, new_async signal (412)=async (401) AND preSync (405), such that new_async signal 412 is a combined signal based on a pre-synchronizer signal and an asynchronous signal. Thus, the additional last stage 410 to logic function 409 can be as simple as AND gate 416. In other embodiments different logic circuits can be used for the last stage and injection of the preSync signal 405. The async signal 401 may indicate an end of an instruction, an arrival of a packet, a battery condition, a thermal condition, or another asynchronous event.

The synchronizing preSync signal 405 can be generated by asserting the preSync signal 405 at the rising (or falling) edge of the clock signal 415 (or a derivative thereof). Thus, referring to FIGS. 4 and 6A, the preSync signal 405 asserts at 603 in response to the rising edge 601 of the clock signal 415. That assumes that the select signal 422 for selector circuit 420 selects the output of one-shot (monostable multivibrator) 421, which outputs a pulse in response to a rising edge of the clock signal. The output of the selector circuit 420 is coupled to the set input of the set/reset flip-flop 418. Thus, the rising edge of the clock signal at 601 causes the preSync signal 405 to assert at 603. Alternatively, the select signal 422 may select the output of the one shot 423 thereby causing the preSync signal 405 to be asserted in response to a falling edge 605 of the clock signal 415.

Figure 6A:
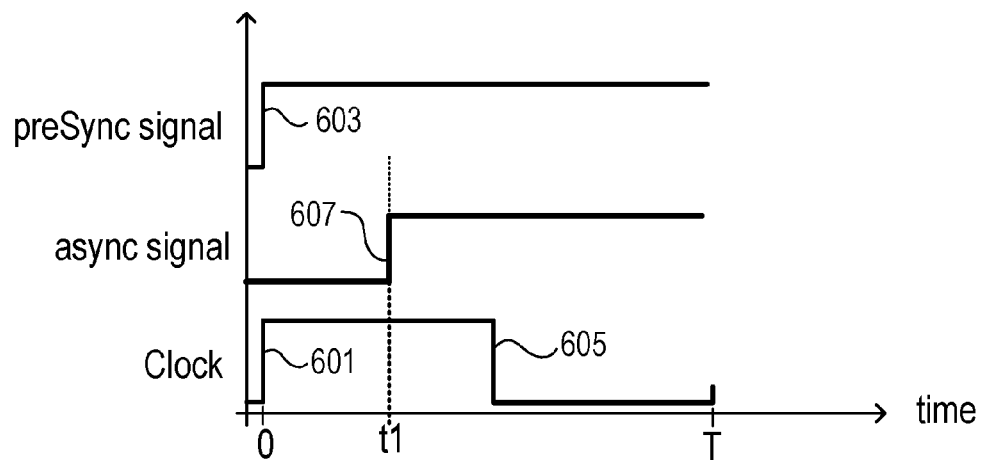
FIG. 6A illustrates a timing diagram showing an asynchronous signal being gated through to the synchronizer.

Referring still to FIGS. 4 and 6A, with the preSync signal asserted at 603 responsive to the rising edge of the clock signal 415 at 601, when the async signal 401 changes at time t1 (607), the assertion of the async signal 401 signal is gated through to the synchronizer circuit 403 through final stage 410.

The synchronizer circuit 403 may synchronize the new_async signal 412 conventionally and supplies an output 430 to circuit 432 that generates a reset pulse. The output of the circuit 432 causes the flip-flop 418 to reset when the new_async signal changes state after the delay of the synchronizer circuit 403, which delay may be several clock cycles of clock 415. The circuit 432 generates a pulse having a width equal to the delay through the chain of inverters. The reset pulse is generated every time the signal 430 from the synchronizer changes state. Thus, the synchronized version of the new_async signal 412 resets the preSync signal 405.

In an embodiment, a divider circuit 425 is used to divide the clock signal 415 resulting in the preSync signal 405 being asserted on the rising (or falling edge) of the clock signal less often. In addition, a delay 406 may be inserted in the preSync signal 405. Delay 406 may be as simple as a chain of inverters or may utilize a different delay implementation. The delay 406 may be used to allow the preSync signal 405 to assert with additional delay after the rising or falling edge of the clock signal. Embodiments may use any or all of the delays described herein, additional delays, or no delays. In addition, the delays may be programmable in order to try and further reduce the metastability exposure based, e.g., on timing analysis of the gate level circuits. That can help ensure that the injection of the foreign synchronous signal preSync 405 into the asynchronous logic function will more likely result in moving the arrival of the new_async signal 412 into a timing window during which the synchronizer circuit will not enter the metastable state. The time delay through the delay block(s) may be selectable by selecting, e.g., the number of stages (if any) in a particular delay block. Thus, the synchronizers may be adapted to their particular metastability environment by programming the delays, selecting the clock edge (rising or falling edge) used to assert the preSync signal 405, choosing whether to use the divider 425 and the divider value (divide by two, divide by four, etc.). Any or all of these features to adapt the synchronizer to its environment may be configured based on control information, stored, e.g., in non-volatile memory.

Figure 6B:
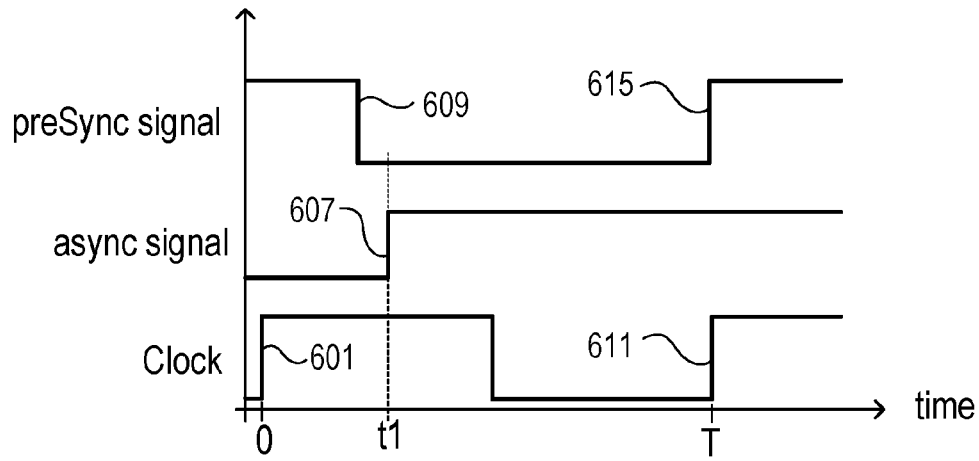
FIG. 6B illustrates an asynchronous signal being blocked.

FIG. 6B illustrates how the gating signal preSync 405 can block the async signal 401. Assume the preSync Signal deasserts at 609 in response to the output of the synchronizer circuit and the reset pulse from circuit 432 (after the delay 406 if present). When the async signal 401 changes at 607, the gating signal (preSync 405) is deasserted forcing the async signal 401 to wait until the preSync signal 405 is again asserted at 615 in response to the rising edge of the clock signal at 611.

Figure 7:
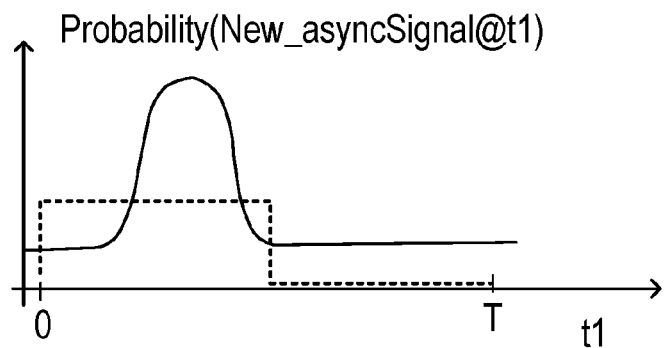
FIG. 7 illustrates an example of a probability distribution of the arrival of an asynchronous signal.

The injection described herein decreases the probability of the synchronizer circuit 403 entering the metastable state, which can increase performance of a system. FIG. 7 illustrates how the probability distribution of the arrival time of new_async signal 412 when referenced to rising edge of the receiving clock will not be uniform, but has a maximum around the time or within a timing window when the probability of entering metastable state is close to zero. That helps reduce the likelihood that metastability occurs during a time period that can result in a metastable state in synchronizer circuit 403. Note that the approach is not 100% effective but does change the probability distribution because the asynchronous function has to wait at times due to the gating by the preSync signal.

The approach described herein can increase the reliability of the system, e.g., increase the MBTF, or decrease the failure in time (FIT) values. The approach can also increase the system performance by lowering the probability of the synchronizer entering the metastable state. As there may be tens of thousands of synchronizers in a system such as a graphics processor, the reduction in the occurrence of metastability can also save power.

Simulation results show the benefit of modifying the arrival time of an asynchronous signal at the synchronizer circuit by injection of receiving clock timing into an additional last stage of the asynchronous logic function. The simulation used a random number generator to generate the async signal 1000 times and monitored the arrival time. Every time the asyncSignal arrived too close to the rising edge of the clock (e.g., within 1000 picosecond window of a 5000 picosecond clock period) was counted as a timing violation and metastability event. The test was run in two modes. The first mode was with no pre-synchronization resulting in 210 metastable events out of 1000 trials. With pre-synchronization such as illustrated in FIG. 4, there were only 121 metastable events, which is a 42% reduction.

The relation between synchronous clock frequency (Fclk) and the average frequency of occurrence of asynchronous signal (async 401) (Fasync) can be important. The signal sampling requirements suggest that the synchronous clock signal (CLK) 415 should be twice the average frequency of the occurrence of asynchronous events. If the average frequency of occurrence is approximately the same as the frequency of the synchronous clock signal there may be need to be a request/ready handshake mechanism between the asynchronous domains and the synchronous domain. If the average frequency of occurrence of asynchronous events is greater than the frequency of the synchronous clock signal, then information may be lost.

Thus, a system for injecting a synchronous signal into an asynchronous function to reduce metastability has been described. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
   generating a pre-synchronizer signal based on at least a first synchronous signal and a second synchronous signal;
   logically combining the pre-synchronizer signal with an asynchronous signal to generate a combined signal, wherein the logically combining comprises ANDing the pre-synchronizer signal with the asynchronous signal;
   supplying the combined signal to a synchronizer circuit; and
   supplying an output of the synchronizer circuit as the first synchronous signal.

2. The method as recited in claim 1 further comprising:
   supplying a clock signal from a synchronous domain as the second synchronous signal for use in generating the pre-synchronizer signal, the synchronous domain being coupled to the output of the synchronizer circuit.

3. The method as recited in claim 2 further comprising:
   asserting the pre-synchronizer signal responsive to a rising or falling edge of the clock signal.

4. The method as recited in claim 2 further comprising:
   dividing the clock signal to generate a divided clock signal; and
   asserting the pre-synchronizer signal responsive to a rising or falling edge of the divided clock signal.

5. The method as recited in claim 2 further comprising:
   generating the asynchronous signal at an asynchronous logic function independently of the clock signal.

6. The method as recited in claim 1 further comprising:
   allowing an asserted state of the asynchronous signal to pass to the synchronizer circuit based on a first state of the pre-synchronizer signal; and
   preventing the asserted state of the asynchronous signal from passing to the synchronizer circuit based on a second state of the pre-synchronizer signal.

7. The method as recited in claim 1 further comprising:
   deasserting the pre-synchronizer signal in response to assertion of the output of the synchronizer circuit.

8. An apparatus comprising:
   a pre-synchronizer circuit coupled to a first synchronous signal and a second synchronous signal and configured to supply a pre-synchronizer signal;
   a logic circuit to logically combine the pre-synchronizer signal and an asynchronous signal and supply a combined signal; and
   a synchronizer circuit coupled to receive the combined signal and to receive a clock signal and configured to generate a synchronized combined signal that is synchronized to a synchronous domain;
   wherein the synchronized combined signal and the clock signal are the first synchronous signal and the second synchronous signal, respectively; and
   wherein the pre-synchronizer circuit is configured to deassert the pre-synchronizer signal in response to assertion of the synchronized combined signal.

9. The apparatus as recited in claim 8 further comprising:
   an asynchronous logic function to generate the asynchronous signal.

10. The apparatus as recited in claim 8, wherein the logic circuit is configured to allow an asserted state of the asynchronous signal to pass to the synchronizer circuit based on a first state of the pre-synchronizer signal and is configured to prevent the asserted state of the asynchronous signal from passing to the synchronizer circuit based on a second state of the pre-synchronizer signal.

11. The apparatus as recited in claim 8 wherein the logic circuit is an AND gate.

12. The apparatus as recited in claim 8, wherein the pre-synchronizer circuit is configured to assert the pre-synchronizer signal responsive to a rising or falling edge of the clock signal.

13. The apparatus as recited in claim 8 further comprising:
   a divider circuit to divide the clock signal and generate a divided clock signal; and
   wherein the pre-synchronizer circuit is configured to assert the pre-synchronizer signal responsive to a rising or falling edge of the divided clock signal.

14. The apparatus as recited in claim 8 wherein the pre-synchronizer circuit is configured to deassert the pre-synchronizer signal in response to a change of state of the synchronized combined signal, the change of state of the synchronized combined signal including the assertion of the synchronized combined signal.

15. The apparatus as recited in claim 14 wherein the pre-synchronizer circuit is coupled to the synchronized combined signal through a logic circuit that generates a pulse in response to the change of state of the synchronized combined signal.

16. An apparatus comprising:
   a pre-synchronizer circuit coupled to a first synchronous signal and a second synchronous signal and configured to supply a pre-synchronizer signal;
   a logic circuit to logically combine the pre-synchronizer signal and an asynchronous signal and supply a combined signal; and
   a synchronizer circuit coupled to receive the combined signal and to receive a clock signal and configured to generate a synchronized combined signal that is synchronized to a synchronous domain;
   wherein the first synchronous signal and the second synchronous signal are respectively, the synchronized combined signal and the clock signal; and
   wherein the pre-synchronizer circuit further includes a flip-flop coupled to supply the pre-synchronizer signal, the flip-flop having a reset input coupled to the synchronized combined signal and a set input coupled to the clock signal.

17. The apparatus as recited in claim 16, wherein the pre-synchronizer circuit further comprises:
- a rising edge circuit configured to generate a first pulse in response to a rising edge of an input signal, the input signal having rising and falling edges based on the clock signal;
- a falling edge circuit configured to generate a second pulse in response to a falling edge of the input signal; and
- a selector circuit coupled to receive the first pulse and the second pulse at first and second inputs, respectively, and to supply one of the first pulse and the second pulse to the set input of the flip-flop according to a select signal.

18. The apparatus as recited in claim 16 further comprising:
- a pulse generating circuit coupled between the synchronizer circuit and the reset input of the flip-flop to supply a reset pulse to the reset input of the flip-flop responsive to the synchronized combined signal changing state.

19. The apparatus as recited in claim 16 further comprising:
- a delay circuit coupled between the flip-flop and the logic circuit to delay the pre-synchronizer signal supplied from the flip-flop.

20. A method comprising:
- generating a pre-synchronizer signal based on an output of a synchronizer circuit and a clock signal;
- gating in a gating circuit an asynchronous signal using the pre-synchronizer signal to allow an asserted value of the asynchronous signal to be supplied to the synchronizer circuit only when pre-synchronizer signal is asserted;
- supplying an output of the gating circuit to the synchronizer circuit;
- deasserting the pre-synchronizer signal responsive to assertion of the output of the synchronizer circuit; and
- asserting the pre-synchronizer signal responsive to an edge of the clock signal.

\* \* \* \* \*